United States Patent [19]

Matsuzawa

[11] Patent Number: 5,138,318
[45] Date of Patent: Aug. 11, 1992

[54] DIFFERENTIAL VOLTAGE BUFFER AMPLIFIER CIRCUIT AND SERIAL-PARALLEL A-D CONVERTER

[75] Inventor: Akira Matsuzawa, Osaka, Japan

[73] Assignee: Matsushita Electric Industrial Co., Ltd., Osaka, Japan

[21] Appl. No.: 598,310

[22] Filed: Oct. 16, 1990

Related U.S. Application Data

[63] Continuation-in-part of Ser. No. 559,088, Jul. 30, 1990.

[30] Foreign Application Priority Data

Oct. 16, 1989 [JP] Japan .................. 1-268444

[51] Int. Cl.⁵ .............................................. H03M 1/34
[52] U.S. Cl. ...................................... 341/156; 330/252
[58] Field of Search ............... 341/155, 156, 158, 159; 330/9, 253, 267, 273, 274, 277, 285, 252, 254, 258, 261; 323/313

[56] References Cited

U.S. PATENT DOCUMENTS

| | | |
|---|---|---|
| 4,635,036 | 1/1987 | Yoshizawa . |
| 4,745,393 | 5/1988 | Tsukada et al. . |
| 4,764,753 | 8/1988 | Yukawa . |
| 4,771,266 | 9/1988 | Nunokawa . |
| 4,851,845 | 7/1989 | Hotta et al. . |

FOREIGN PATENT DOCUMENTS 3405438  8/1985  Fed. Rep. of Germany .

OTHER PUBLICATIONS

Patent abstracts of Japan, unexamined applications, E field, vol. 13, No. 88 (E-721), Feb. 28, 1989 The Patent Office Japanese Government p. 120 E 721.
Soviet Patents abstracts, E1 section, week 8909, 1989 Derwent Publications Ltd., London, U 21, p. 8.
Soviet Inventions Illustrated, E1 section, week 8814, May 18, 1988 Derwent Publication Ltd., London, U 21, pp. 21-22.
Soviet Inventions Illustrated, E1 section, week 8707, Apr. 1, 1987 Derwent Publications Ltd., London, U 21, p. 5.
Soviet Patent abstracts, E1 section, week 8947, 1990 Derwent Publications Ltd., London, U 21, p. 10.

*Primary Examiner*—Howard L. Williams
*Assistant Examiner*—B. K. Young
*Attorney, Agent, or Firm*—Lowe, Price, LeBlanc & Becker

[57] ABSTRACT

An improved differential voltage buffer amplifier circuit of the type having a pair of transistors connected in emitter-follower configuration with an input differential voltage signal applied between the bases thereof and a load resistor connected between the emitters thereof, which further includes a compensation circuit for eliminating a voltage transfer error resulting from current flow through the load, for thereby achieving a voltage gain value that is very close to one. The buffer circuit is particularly advantageous for use in a new high-accuracy A-D converter which is suitable for integrated circuit implementation.

5 Claims, 7 Drawing Sheets

DIFFERENTIAL VOLTAGE BUFFER AMPLIFIER CIRCUIT AND SERIAL-PARALLEL A-D CONVERTER

BACKGROUND OF THE INVENTION

The present application is a continuation in part of U.S. patent application Ser. No. 559,088, with U.S. filing date of Jul. 30, 1990, having the title "Serial-Parallel Type A/D Converter".

FIELD OF APPLICATION

The present invention relates to a differential voltage buffer amplifier circuit, and in particular to an improved differential voltage buffer amplifier circuit providing a voltage gain that is substantially equal to one and having a simple circuit configuration.

The invention further relates to a serial-parallel analog-to-digital converter which incorporates a plurality of such differential voltage buffer amplifier circuits, whereby highly accurate analog/digital conversion is achieved with a simple circuit configuration.

PRIOR ART TECHNOLOGY

Figure 1:
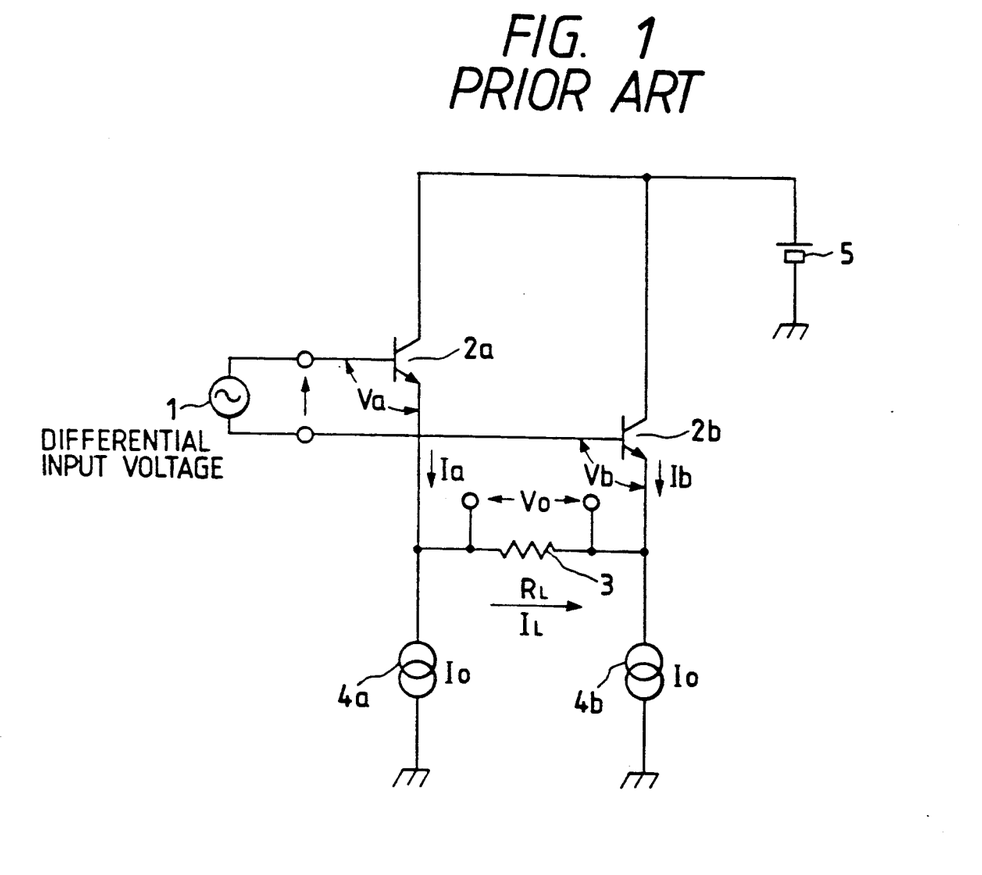
FIG. 1 is a circuit diagram of an example of a prior art buffer amplifier circuit.

FIG. 1 is a circuit diagram of an example of a prior art differential voltage buffer amplifier circuit (referred to in the following simply as a buffer amplifier circuit), for acting as a buffer for an input differential voltage signal while providing a value of voltage gain that is approximately equal to 1. The input differential signal 1 is applied between the respective bases of a pair of transistors 2a and 2b, while the emitters of these transistors are connected to respective ends of a load resistor 3, with an output voltage being developed across the load resistor 3. In addition, the emitters of the transistors 2a, 2b are connected to respective constant current sources 4a and 4b, and the collectors of transistors 2a, 2b are each coupled to a supply voltage source 5, i.e. the transistors 2a, 2b are each connected in an emitter-follower configuration, with the respective outputs being applied across the load resistor 3. Thus, the voltage that appears across the load resistor 3 is approximately equal to that of the input differential signal 1.

However with such a prior art buffer amplifier circuit, when a voltage is developed across the load resistor 3, then a difference will arise between the respective operating currents of the transistors 2a, 2b (where the term "operating current" as used herein refers to the emitter current of each transistor), so that the voltage gain of the buffer amplifier circuit is actually less than 1, with the voltage gain value depending upon the level of voltage developed across the load resistor 3. Assuming for simplicity that the current amplification factor of each transistor in the grounded-base configuration is exactly equal to 1, designating the respective base-emitter voltages of the transistors 2a, 2b as Va, Vb, and the respective operating currents of the transistors 2a, 2b as Ia, Ib, and designating the value of current supplied by each of the constant current sources 4a, 4b as Io, the output voltage that appears across the load resistor 3 as Vo, the value of resistance of the load resistor 3 as RL, the value of current which flows through the load resistor 3 as IL, then a voltage error $\Delta V$ that arises in the differential voltage between the respective base-emitter voltages of the transistors 2a, 2b is expressed by the following equation:

$$\Delta V = Va - Vb = VT \ln((Io+IL)/(Io-IL))$$
$$= 2VT \cdot IL/Io \quad \text{(1a)}$$

Or by the equation:

$$\Delta v = 2VT \cdot Vo/(Io \cdot RL) \quad \text{(1b)}$$

In the above, VT denotes a temperature voltage

As will be clear from the above, an error voltage arises between the input and output sides of such a prior art buffer amplifier circuit. If for example it is assumed that the value of current IL that flows in the load resistor 3 is $\frac{1}{2}$ of the current value Io that is supplied from each of the constant current sources, then the voltage error $\Delta V$ will be approximately equal to 2.5 mV. Due to such a voltage error being produced, causing the voltage gain to be less than 1, the A-D conversion accuracy is unsatisfactory when such a buffer amplifier circuit is used in an analog-to-digital converter.

SUMMARY OF THE INVENTION

It is an objective of the present invention to overcome the above problem, by providing an improved differential voltage buffer amplifier circuit in which such a voltage error is effectively suppressed.

It is a further objective of the present invention to provide a highly accurate analog-to-digital converter which utilizes such an accurate buffer amplifier circuit.

To achieve the above objectives, according to a first aspect, the present invention provides a buffer amplifier circuit comprising:

a first pair of transistors coupled to receive an input differential voltage signal applied between respective bases thereof, and having a load resistor coupled between respective emitters thereof, for producting an output differential voltage signal across the load resistor; and a second pair of transistors coupled to receive the input differential voltage signal applied between respective bases thereof, and having a compensation resistor coupled between respective emitters thereof, respective ones of the second pair of transistors being coupled to supply a fixed value of operating current to each of corresponding ones of the first pair of transistors, irrespective of changes in level of the input differential voltage signal.

Such a buffer amplifier circuit can further comprise level shifting circuit means for receiving the input differential voltage signal, to produce a level-shifted input differential voltage signal, with the level-shifted differential voltage signal being applied between the bases of the second pair of transistors.

According to a second aspect, the present invention provides an analog-to-digital converter comprising:

means for generating a plurality of reference voltages;

a plurality of differential conversion circuits for converting respective potential differences between a common analog input signal and the reference voltages to corresponding differential signals;

high-order analog-to-digital converter means including a first plurality of comparators for comparing the analog input signal with respective ones of the reference voltages, to produce respective first comparison signals, and logic circuit means for producing high-order bits of an output digital signal based on the first comparison signals;

selection means for selecting a specific plurality of the differential signals in accordance with a condition of the comparison signals;

a plurality of differential buffer amplifier circuits coupled to receive the selected differential signals;

voltage divider means for voltage-dividing the selected differential signals, transferred from the buffer amplifier circuits; and low-order analog-to-digital converter means including a second plurality of comparators for comparing respective potential differences produced in the voltage divider means for producing respective second comparison signals, and logic circuit means for producing low-order bits of the output digital signal based on the second comparison signals;

in which each of the buffer amplifier circuits comprises:

a first pair of transistors coupled to receive an input differential voltage signal applied between respective bases thereof, and having a load resistor coupled between respective emitters thereof, for producing an output differential voltage signal across the load resistor; and a second pair of transistors coupled to receive the input differential voltage signal applied between respective bases thereof, and having a compensation resistor coupled between respective emitters thereof, respective ones of the second pair of transistors being coupled to supply a fixed value of output current to each of corresponding ones of the first pair of transistors, irrespective of changes in level of the input differential voltage signal.

DESCRIPTION OF PREFERRED EMBODIMENTS

Figure 2:
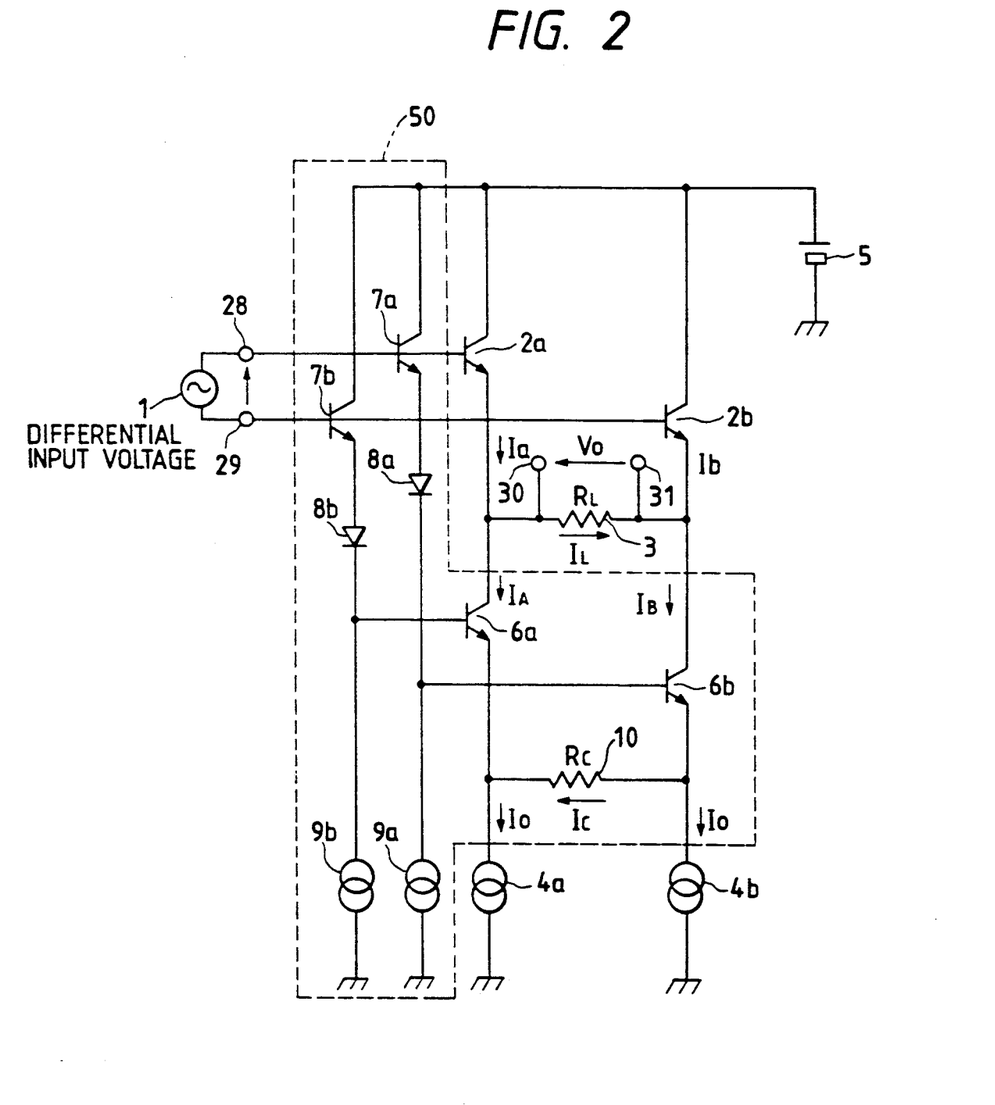
FIG. 2 is a circuit diagram of a embodiment of a buffer amplifier circuit according to the present invention.

FIG. 2 is a circuit diagram of an embodiment of a buffer amplifier circuit according to the present invention. In FIG. 2, a first pair of transistors 2a, 2b and a load resistor 3 correspond to the identically numbered components in the prior art example of FIG. 1, with an input differential signal voltage 1 being applied between the bases of the transistors 2a, 2b through input terminals 28 and 29, and an output voltage being produced across the load resistor 3 which is connected to output terminals 30, 31 between the emitters of the transistors 2a, 2b, and with the collectors of the transistors 2a, 2b being connected to a power supply voltage source 5. The circuit further includes transistors 7a, 7b, diodes 8a, 8b and constant current sources 9a, 9b, which in combination are connected to form a level shifting circuit, for executing level shifting of the input differential signal 1, with the resultant level-shifted differential signal being produced between the respective cathodes of the diodes 8a and 8b. That level-shifted differential signal is applied between the bases of a second pair of transistors 6a, 6b. The emitters of the transistors 6a, 6b are connected to respective terminals of a compensation resistor 10, and are also connected to respective constant current sources 4a and 4b. The collectors of the transistors 6a, 6b are connected to respective emitters of the transistors 2a, 2b.

It can be understood that the buffer amplifier circuit of FIG. 2 consists of the prior art buffer amplifier circuit of FIG. 1 with the addition of a compensation circuit 50, shown within the broken-line outline.

The voltage error that is produced between the respective base-emitter voltages of the transistors 2a, 2b will be calculated in the following in the same way as for the prior art example of FIG. 1. Designating the respective current values supplied by the constant current sources 4a, 4b as each being equal to Io, the resistance value of the compensation resistor 10 as Rc, the value of current that flows in the compensation resistor 10 as Ic, then the respective values of operating current (i.e. collector current) IA and IB that flow in the transistors 6a, 6b are obtained as:

$$IA = Io - Ic, IB = Io + Ic \qquad (2)$$

Designating the value of the input differential signal voltage 1 as VI, then the current Ic that flows in the compensation resistor 10 (having resistance value Rc) is obtained by using equation 1 (a) above as:

$$Ic = (VI - \Delta V)/Rc = (VI - 2VT \times Ic/Io)/Rc \qquad (3a)$$

Therefore, $$Ic = VI/(Rc + 2VT/Io) \qquad (3b)$$

Assuming that the value of current Ic that flows in the compensation resistor 10 is identical to the current IL of the load resistor 3, then the respective operating currents Ia, Ib of the transistors 2a and 2b will be mutually identical, so that the voltage error $\Delta V$ and gain error can easily be made extremely small. Specifically, the values IL and RL of the compensation resistor 10 when the voltage error $\Delta V$ and gain error are zero are related as follows:

$$IL = VI/RL \qquad (4)$$

so that, from equations (3b) and (4), the voltage error $\Delta V$ and gain error will be brought close to zero if the following condition is met:

$$Rc = RL - 2VT/Io \qquad (5)$$

Thus if the value Rc of the compensation resistor 10 meets the above condition, a very low amount of error can be achieved for the buffer amplifier circuit.

Figure 3:
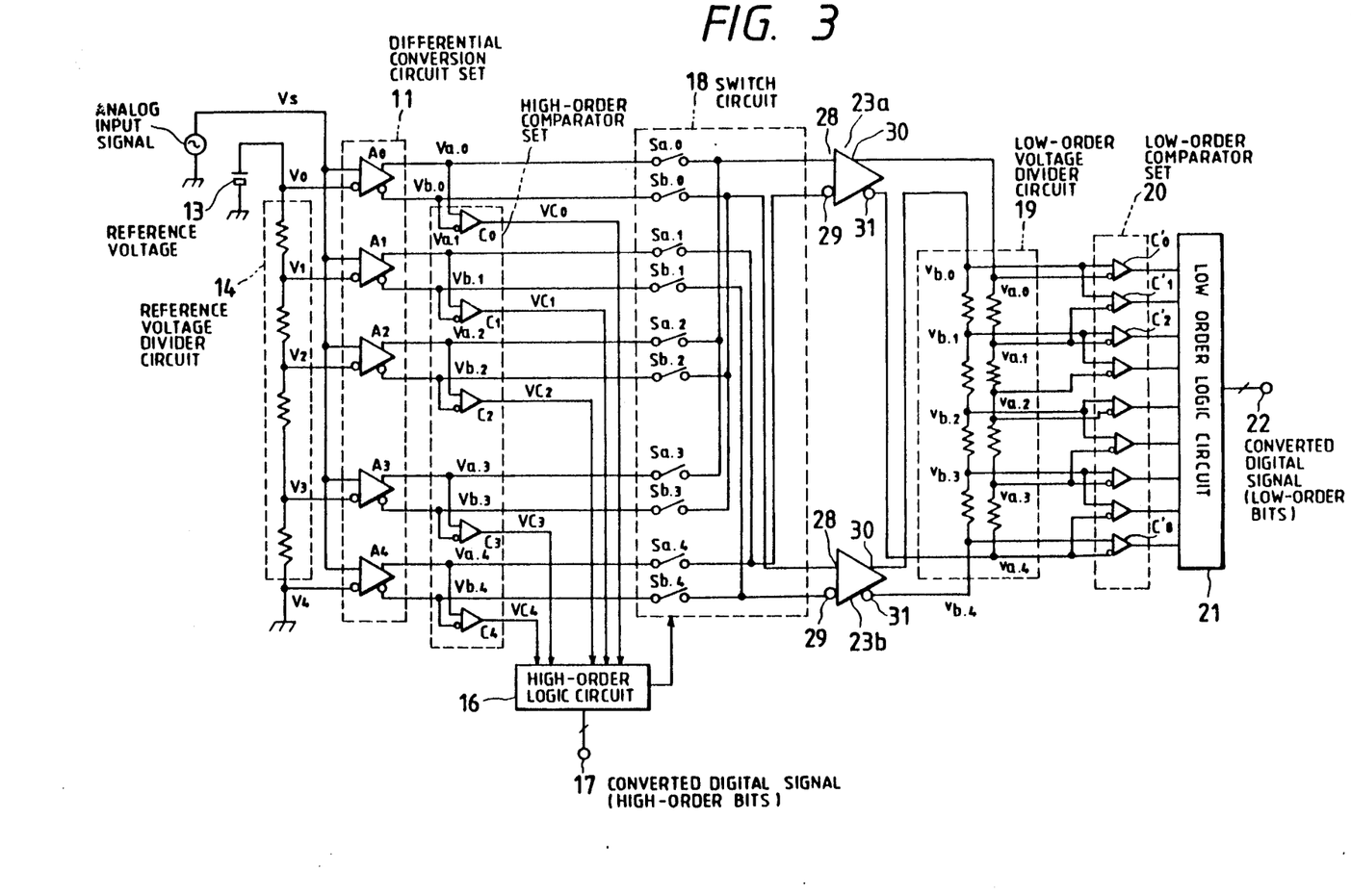
FIG. 3 is a circuit diagram of an embodiment of an analog-to-digital converter which incorporates a plurality of buffer amplifier circuits according to the present invention.

Such a highly accurate buffer amplifier circuit can be advantageously used in a specific analog-to-digital converter which has been previously proposed by the assignee of the present invention in the aforementioned U.S. patent application, as will be described in the following. FIG. 3 is a circuit diagram of such an analog-to-digital converter which incorporates two buffer amplifier circuits each in accordance with the embodiment of FIG. 2 described above. The analog-to-digital converter (referred to in the following simply as A-D converter) functions to convert successive values of an analog input signal 12 into corresponding digital signal values, each of the digital signal values being made up of a set of high-order bits (i.e. extending downward in significance from the most significant bit) and a set of low-order bits (i.e. extending upward in significance from the least significant bit). A reference voltage 13 of value V0 is applied to a resistive voltage divider for thereby producing a plurality of reference voltages, designated as V0 to V4. It would however be equally possible to use some arrangement for producing such a plurality of reference voltages other than such a resistive voltage divider. A differential conversion circuit set 11 is made up of a set of differential amplifier circuits A0 to A4 serving as differential conversion circuits, each having one input terminal connected in common to the analog input signal 12 and a second input terminal connected to a corresponding one of the plurality of reference voltages V0 to V4. Each of the differential conversion circuits thereby converts a potential difference between the analog input signal 12 and the corresponding one of the reference voltages V0 to V4 into a differential signal, which in this embodiment is a differential voltage signal.

A high-order comparator circuit set 15 is made up of a set of comparators C0 to C4, each of which receives a corresponding one of the differential signals produced from the differential conversion circuit set 11 as an input signal, and has a first input terminal connected to the non-inverting output terminal of the corresponding one of the differential conversion circuits A0 to A4 and a second input terminal connected to the inverting output terminal of the corresponding differential conversion circuit. Respective comparison signals VC0 to VC4 are thereby produced from the high-order comparator circuit set 15, and are supplied to a low-order logic circuit 16. The low-order logic circuit 16 produces the high-order bits of the output digital signal, in accordance with the states of the comparison signals VC0 to VC4.

The low-order logic circuit 16 also produces selection control signals which are supplied to a switch circuit 18, for controlling selection of specific ones of the differential signals produced from the differential conversion circuit set 11, in accordance with the states of the comparison signals VC0 to VC4. More specifically the switch circuit 18 selects the inverting output terminals and non-inverting output terminals of two adjacent ones of the differential conversion circuits A0 to A4 (i.e. which produce the selected differential signals) to be connected to four output terminals 34 to 37 of the switch circuit 18. The term "two adjacent ones" as used herein in referring to the differential signals and the differential conversion circuits signifies two differential signals or two differential conversion circuits which correspond to two successively adjacent ones of the plurality of reference voltages V0 to V4. For example, the term "two adjacent ones" is applicable to the differential conversion circuits A1, A2, or to the differential signals produced therefrom.

The differential signals thus selected by the switch circuit 18 under the control of the low-order logic circuit 16 are transferred through two differential voltage buffer amplifier circuits 23a, 23b to a low-order voltage divider circuit 19, which in this embodiment is made up of first and second resistive voltage dividers 19a and 19b. In this embodiment, the selected differential signals are transferred by the switch circuit 18 via the buffer amplifier circuits 23a, 23b such that the respective non-inverting output terminals of the two differential conversion circuits producing the selected differential signals are connected to opposite ends of the resistive voltage divider 19a, while the respective inverting output terminals of these two differential conversion circuits are connected to opposite ends of the resistive voltage divider 19b. Thus for example if the differential signals produced from the differential conversion circuits A1 and A2 of the differential conversion circuit set 11 were selected, then the non-inverting output terminal outputs $V_{a,1}$ and $V_{a,2}$ from the differential conversion circuits A1, A2 would be respectively transferred by the switch circuit 18 and then through the buffer amplifier circuits 23a, 23b to be connected to the lower and upper ends of the resistive voltage divider 19a, while the inverting output terminal outputs $V_{b,1}$ and $V_{b,2}$ would similarly be respectively connected to the lower and upper ends of the resistive voltage divider 19b.

Specific pairs of the voltages $v_{b,0}$ to $v_{b,4}$ and and $v_{a,0}$ to $v_{a,4}$ that are thereby produced in the resistive voltage dividers 19b, 19a respectively of the low-order voltage divider circuit 19 are compared by means of a set of comparators in a low-order comparator circuit set 20, as shown. The resultant comparison signals that are produced from the low-order comparator circuit set 20 are inputted to a low-order logic circuit 21, which produces the low-order bits of the digital output signal in accordance with the states of these comparison signals.

It should be noted that although in this embodiment the comparators of the high-order comparator circuit set 15 compare the respective voltage differences between the analog input signal and the various reference voltages V0, V1 etc. indirectly, i.e. based on the output differential signals produced from the differential conversion circuit set 11, it would be equally possible to connect the input terminals of the high-order comparator circuit set 15 directly to the analog input signal 12 and to receive the respective reference voltages produced from the reference voltage divider circuit 14. However executing comparison based on the differential signals produced from the differential conversion circuit set 11 has the advantage of higher accuracy being obtained, as a result of the current gain provided by each of the differential conversion circuits in the differential conversion circuit set 11.

In FIG. 3, each of the buffer amplifiers 23a, 23b is configured in accordance with the circuit embodiment of FIG. 2 of the present invention, described hereinabove, with four output lines from the switch circuit 18 being respectively connected to the input terminals 36, 37 of each of these buffer amplifiers as shown. The resistive voltage divider 19a constitutes the load resistor of the buffer amplifier circuit 23a, i.e. the resistive voltage divider 19a is connected between the output terminals 30, 31 of the buffer amplifier circuit in place of the load resistor 3 in the circuit of FIG. 2. Similarly, the resistive voltage divider 19b constitutes the load resistor of the buffer amplifier circuit 23b.

Figure 4A:
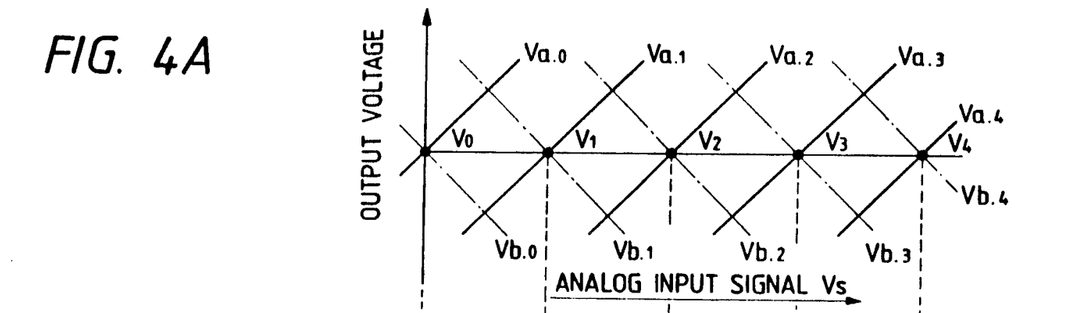
FIGS. 4A, 4B, 4C are diagrams for assistance in describing the operation of the analog-to-digital converter embodiment of FIG. 3.
Figure 4B:
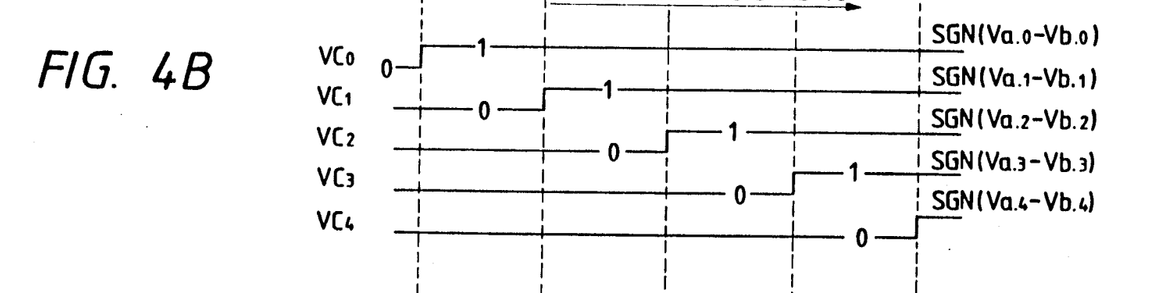
Figure 4C:
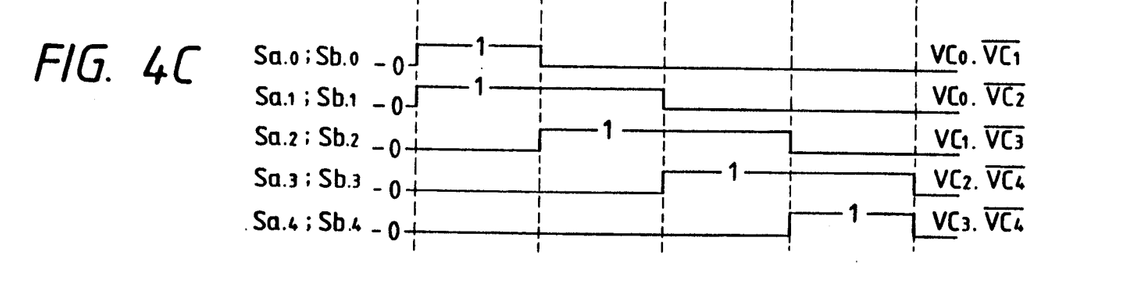

FIGS. 4A, 4B and 4C are diagrams for illustrating the operation of the circuit of FIG. 3. FIG. 4A shows the relationships between the level of the analog input signal 12 and respective output voltages $v_{a,0}, v_{a,1}, \ldots v_{a,4}$ that are produced from the non-inverting output terminals of the differential conversion circuit set 11 and the respective output voltages $v_{b,0}, v_{b,1}, \ldots v_{b,4}$ produced from the inverting output terminals of the differential conversion circuit set 11, with the respective differential signals being equal to $(v_{a,0}-v_{b,0}), (v_{a,1}-v_{b,1}) \ldots (v_{a,4}-v_{b,4})$, each representing a difference between the analog input signal 12 and one of the plurality of reference voltages V0 to V4 produced from the reference voltage divider circuit 14. The values of the non-inverting output terminal voltages $v_{a,0}$ to $v_{a,4}$ and of the inverting output terminal voltages $v_{b,0}$ to $v_{b,4}$ in the vicinity of each reference voltage value can be expressed by the following equations:

$$V_{a,i} = G(Vs - Vi) + Vb \quad (i=0 \text{ to } 4) \tag{6-1}$$

$$V_{b,i} = -G(Vs - Vi) + Vb \quad (i=0 \text{ to } 4) \tag{6-2}$$

In the above, G denotes the voltage gain of each of the differential conversion circuits A0 to A4, while Vb is a bias voltage.

As shown by these equations, the non-inverting output terminal voltages and inverting output terminal voltages produced from the high-order comparator circuit set 15 each vary linearly in accordance with the level of the analog input signal 12. The polarity of each of these voltages switches over as the analog input signal level moves past the respective reference voltage.

The comparison signals VC0 to VC4 that are respectively produced from the comparators C0 to C4 of the high-order comparator circuit set 15 as the analog input signal level moves through the reference voltage range from V0 to V4 of FIG. 4A are shown in FIG. 4B. Each of the comparators of the high-order comparator circuit set 15 has the input terminals thereof connected to respective output terminals of a corresponding one of the differential conversion circuits A0 to A4 of the differential conversion circuit set 11, so that the output signal from each of the comparators C0 to C4 is given by the following:

$$VCi = sgn(V_{a,i} - V_{b,i}) \quad (i=0 \text{ to } 4) \tag{7}$$

In the above, the function sgn is defined as follows:

$$sgn(x) = 1 : x \geq 0 \tag{8-1}$$

$$sgn(x) = 0 : x < 0 \tag{8-2}$$

Inserting the equations (6-1) and (6-2) into the equation (7), the following is obtained:

$$VCi = sgn(G(V_s - V_i)) \quad (i=0 \text{ to } 4) \tag{9}$$

As shown in FIG. 4B, the outputs of each of the comparators C0 to C4 changes from the logic 0 to the logic 1 level when the level of the analog input signal 12 moves above the corresponding reference voltage value that is applied to the corresponding one of the differential conversion circuits A0 to A4. These output comparison signals from the high-order comparator circuit set 15 are supplied to the low-order logic circuit 16, for thereby producing the high-order bits of the output digital signal.

FIG. 4C shows the relationships between control of switch selection by the switch circuit 18 (by the control signal applied to the switch circuit 18 from the low-order logic circuit 16) and the states of the output signals VC0 to VC4 from the high-order comparator circuit set 15. In FIG. 4C, the "1" symbol indicates that a pair of switches is in the closed (i.e. ON) state, while the "0" symbol indicates that the pair of switches is in the open (i.e. OFF) state.

Basically, the control of selection operations by the switch circuit 18 in accordance with the control signal from the low-order logic circuit 16 is as follows. Of a set of differential signals produced from the differential conversion circuit set 11 for which each of the corresponding reference voltage values is higher than the level of the analog input signal 12, the output differential signal corresponding to the lowest of these reference voltage values is selected. In addition, of the set of differential signals from the differential conversion circuit set 11 for which each of the corresponding reference voltage values is lower than the level of the analog input signal 12, the output differential signal corresponding to the highest of these reference voltage values is selected.

The above operation can be expressed in general by the following:

$$S_{a,i}; S_{b,i}; S_{a,i+1}; S_{b,i+1} = 1 : V_i < V_s < V_{i+1} \tag{10}$$

Expressing the above in terms of the output signals from the comparators C0 to C4, the following is obtained:

$$S_{a,i}; S_{b,i} = VCi - 1 \cdot \overline{VCi+1} \tag{11}$$

$S_{a,0}, S_{b,0}, S_{a,4}$, and $S_{b,4}$ are excluded from the above relationship. These switches, which are positioned at the outer ends of the set of switches in the switch circuit 18 are configured differently from the other switches, and for that reason the general equation (11) does not apply to these.

The A-D conversion operation for the low-order bits of the output digital signal will be described referring to FIG. 5, which show how the voltages at the respective nodes of the low-order voltage divider circuit 19 vary in accordance with variation in level of the analog input signal 12. Vi and Vi+1 represent two adjacent ones of the reference voltage values V0 to V4 produced by the reference voltage divider circuit 14, (for example, the reference voltages that correspond to the two differential signals from the differential conversion circuit set 11 which are currently selected by the switch circuit 18). Each of the resistive voltage dividers 19a, 19b is formed of a series-connected set of mutually identical resistors. Of the two differential signal voltages that are selected by the switch circuit 18, the non-inverting output terminal side of one of these voltages is applied (transferred through one of the buffer amplifier circuits 23a, 23b) to one end of the resistive voltage divider 19a and the non-inverting output terminal side of the other differential signal voltage is applied to the other end of that divider. Similarly, the inverting output terminal side of one of these voltages (also transferred through one of the buffer amplifier circuits 23a, 23b) is applied to one end of the resistive voltage divider 19b and the inverting output terminal side of the other differential signal voltage is applied to the other end of divider 19b. As a result, voltage-divided values $v_{a,0}$ to $v_{a,4}$ are produced from the resistive voltage divider 19a and values $v_{b,0}$ to $v_{b,4}$ from the resistive voltage divider 19b. Pairs of these voltage-divided values $v_{a,0}$ to $v_{a,4}$ and $v_{b,0}$ to $v_{b,4}$ are then compared in a set of nine comparators in the low-order comparator circuit set 20, with the nine comparison output voltage changeover points of these comparators respectively corresponding to the nine voltage values $V_i$, $v_1$, $v_2$, $v_3$, $v_4$, $v_5$, $v_6$, $v_7$ and $V_i+1$ shown in FIG. 5. Thus, a 3-bit resolution is achieved by the low-order logic circuit 21 which receives the operation comparison signals from the low-order comparator circuit set 20, i.e. the 3 low-order bits of the output digital signal are produced from the low-order logic circuit 21.

Figure 5:
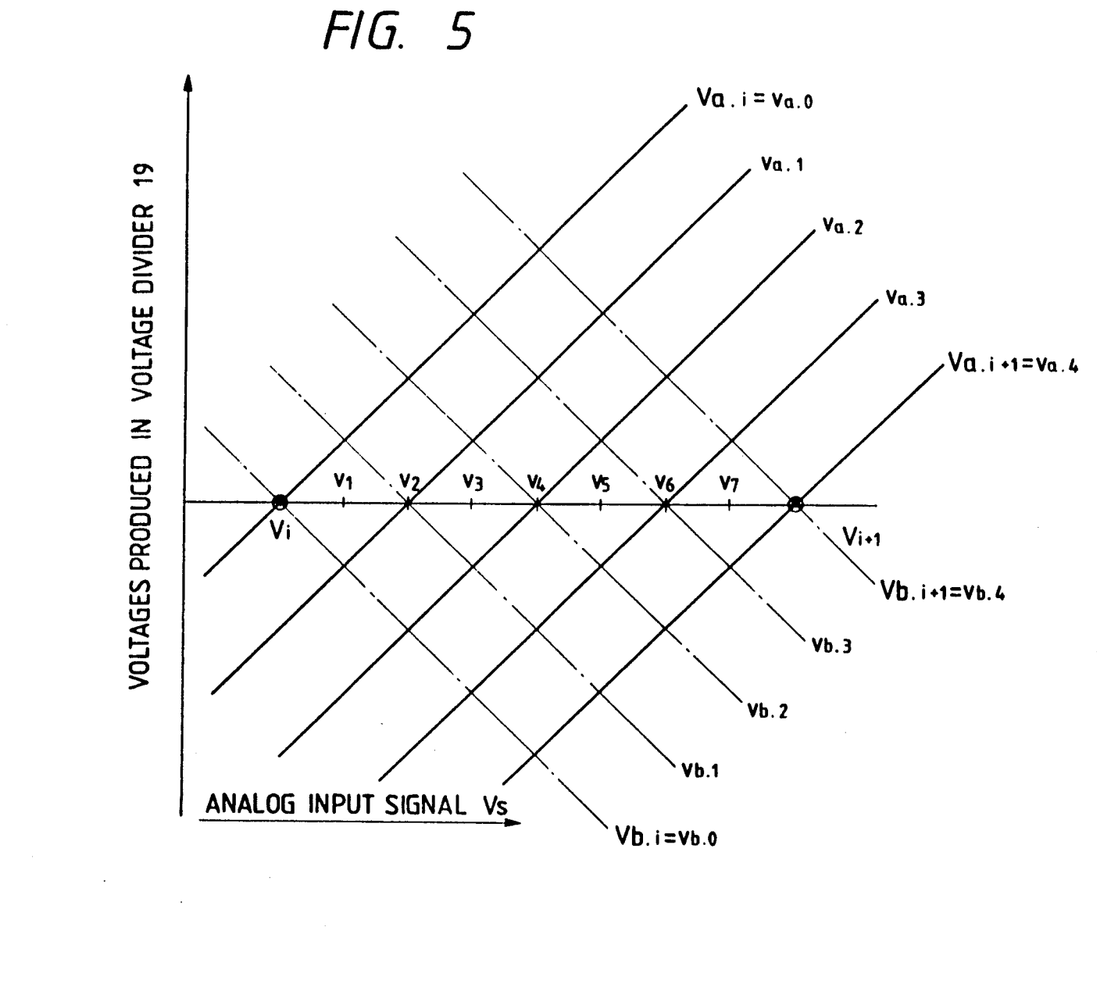
FIG. 5 shows an input/output signal relationship, for assistance in describing the operation of low-order A-D conversion in the circuit of FIG. 3.

It can thus be understood from FIG. 5 that such a circuit arrangement for executing low-order D/A conversion is equivalent to using a set of reference voltage values obtained by dividing the range between two adjacent reference voltage values of the reference voltage divider circuit 14 (e.g. between V1 and V2) into 8 equal parts. However this is achieved without using a separate reference voltage source for executing the low-order D/A conversion. Such a low-order A-D conversion operation can be expressed as follows:

$$sgn(V_s - v_{2i}) = sgn(v_{a,i} - v_{b,i})(i=1 \text{ to } 3) \quad (12\text{-}1)$$

$$sgn(V_s - v_{2i+1}) = sgn(v_{a,i+1} - v_{b,i})(i=1 \text{ to } 3) \quad (12\text{-}2)$$

The output voltages produced from the low-order voltage divider circuit 19 are connected to respective ones of a set of nine comparators which constitute the low-order comparator circuit set 20, in accordance with the above equations (12-1), (12-2). Thus, the voltages $v_{a,0}$ and $v_{b,0}$ are compared in a first comparator C'0, the voltages $v_{b,0}$ and $v_{a,1}$ are compared in a second comparator C'1, and so on.

The following advantages are obtained by such a serial-parallel type of A-D converter:

(1) With a prior art A-D converter, it is necessary for the full-scale voltage to be matched to that of an original D/A converter. However the circuit of FIG. 3 provides a highly accurate A-D converter that does not require such matching of the full-scale voltage. In addition, the overall circuit of the A-D converter is simplified, since it is no longer necessary to incorporate a circuit for ensuring such full-scale voltage matching. Moreover, the value of the reference voltage 13 (from which the plurality of reference voltages are derived) can be freely altered, for example in accordance with an externally supplied signal.

(2) With the circuit of FIG. 3, it is not necessary to utilize high-accuracy operational amplifiers. A simple differential amplifier circuit can be used for each of the circuits A0 to A4 of the differential conversion circuit set 11, and it is not necessary for each of these to have a high absolute accuracy of gain, so long as all of these differential amplifier circuits are well matched with respect to gain. Thus, a simple combination of a pair of transistors connected in the emitter-follower or source-follower configuration to form a differential amplifier circuit can be utilized to implement each of the differential conversion circuits of the differential conversion circuit set 11. The A-D converter of FIG. 3 is inherently suitable for implementation as an integrated circuit. Thus, since it is easily possible to achieve accurate matching of gain between different transistors that are formed within the same integrated circuit chip, there will be no disadvantage in using such simple differential amplifier circuits to configure the differential conversion circuit set 11. In addition, although a high accuracy of voltage gain is desirable for the buffer amplifier circuits 23a, 23b as described hereinafter, each of these is configured in accordance with the embodiment of FIG. 2, so that a simple circuit arrangement can also be used for each of these buffer amplifier circuits, without the need for the circuit complexity of two operational amplifiers. Thus, a high-speed highly accurate serial-parallel type of A-D converter can be configured having a simple circuit arrangement, which is highly suited to being formed in an integrated circuit.

(3) With the A-D converter embodiment of FIG. 3, it is not necessary to provide a reference voltage for use in low-order analog/digital conversion that is matched to the full-scale voltage. This is because the A-D converter of the present invention does not use a fixed reference voltage for low-order analog/digital conversion, as is required in the prior art. Instead, voltage dividers are used to divide a selected plurality of differential voltages that have been derived by comparing the analog input signal with fixed reference voltages derived from a single reference voltage source, with output voltages from these voltage dividers being compared to thereby execute low-order analog/digital conversion. Alternatively stated, the reference voltages used for the low-order analog/digital conversion can be considered as being obtained by evenly sub-dividing a reference voltage that is used for high-order analog/digital conversion. Thus there is inherently a high degree of matching between the high-order and low-order analog/digital conversion, so that the overall conversion accuracy is very high.

(4) Due to the fact that the input signals that are used for the low-order analog/digital conversion are differential signals, there is an inherently high degree of rejection of common-mode noise, such as power source noise etc. Thus, the invention enables a stable and highly accurate serial-parallel type of A-D converter to be achieved.

In the embodiment of FIG. 3, circuits 23a, 23b serve as buffers for transferring buffer the selected output voltages produced from the differential conversion circuit set 11 to the low-order voltage divider circuit 19. By using the buffer amplifier circuit embodiment of FIG. 2 for each of these circuits 23a, 23b, a greater accuracy of analog/digital conversion can be achieved than would be possible by using simple buffer amplifier circuits (e.g. of the form shown in FIG. 2) for the circuits 23a, 23b. This will be described referring to FIGS. 6A, 6B and 7A, 7B. Firstly, if each of the buffer amplifier circuits 23a, 23b were to be configured as a simple prior art differential amplifier circuit of the form shown in FIG. 1 and described hereinabove, having a voltage gain of less than 1, then the voltage range (i.e. capture range) of interpolated analog/digital conversion executed using the outputs of these two differential amplifier circuit output voltages would be as shown in FIG. 6B, i.e. from $V_{i-1} + \Delta V/(2G)$ to $V_i - \Delta V/(2G)$ (where $V_{i-1}$, $V_i$ and $V_{i+1}$ are respective reference voltages that are supplied to successively adjacent ones of the differential conversion circuit set 11, the error voltage of the each differential amplifier circuit is $\Delta V$, and the voltage gain of each amplifier is G). Thus, there will be a gap of $\Delta V/G$ between two adjacent capture ranges, i.e. a voltage range in which interpolated analog/digital conversion does not occur. In the operation of an actual A-D converter, that would have the same effect on the conversion results as an overload. As a result, the analog/digital conversion characteristic would be as shown in FIG. 7B, when the analog input signal is in the vincinity of the reference voltage value $V_i$.

Figure 6A:
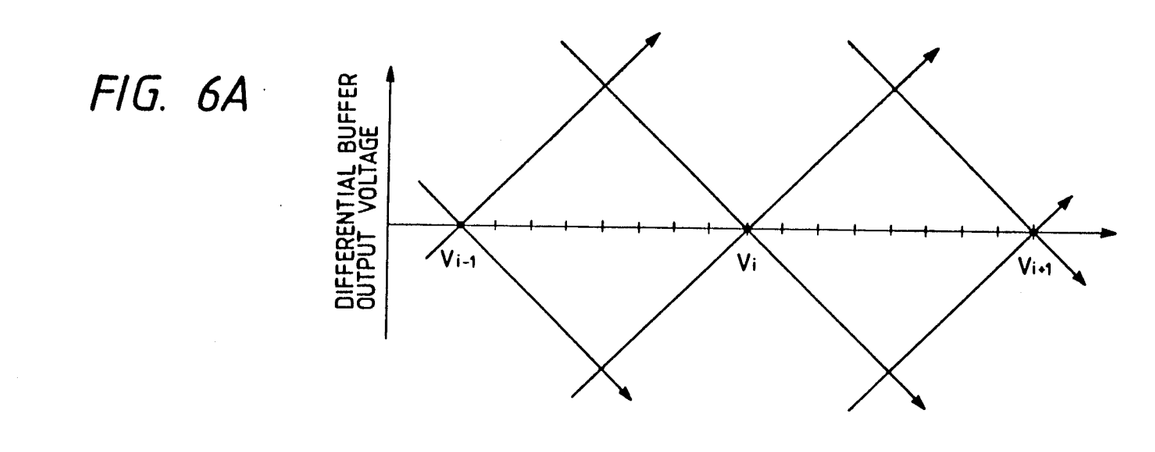
FIGS. 6A, 6B show input/output signal relationships, for describing an advantage provided by the buffer amplifier circuit embodiment of FIG. 2 in the circuit of FIG. 3.
Figure 6B:
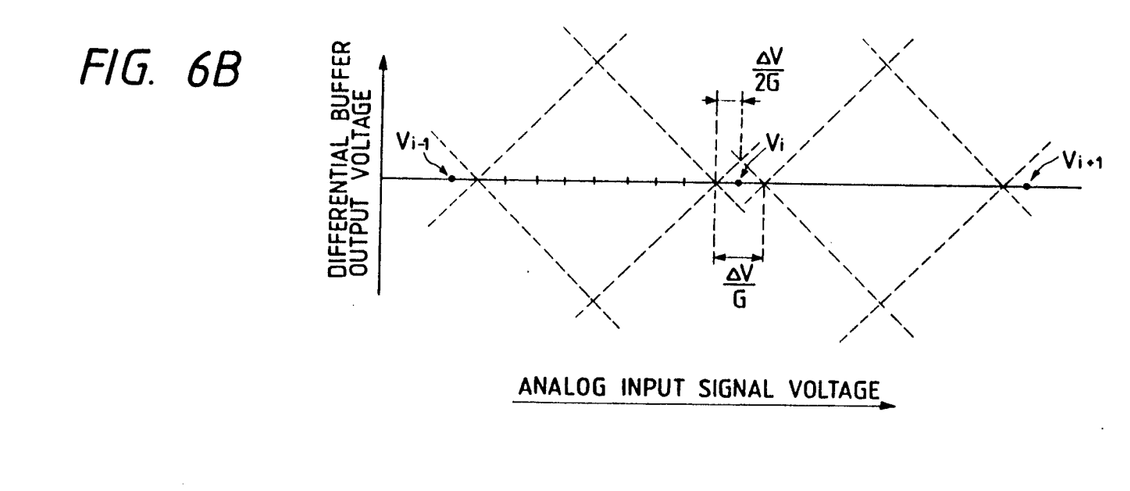
Figure 7A:
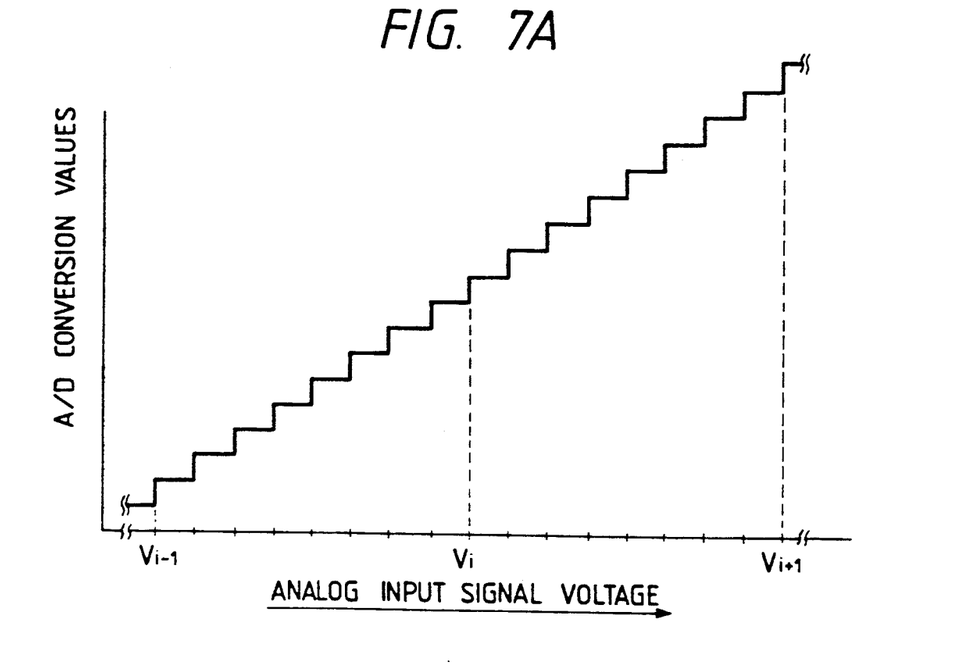
FIGS. 7A, 7B show analog-to-digital conversion characteristics.
Figure 7B:
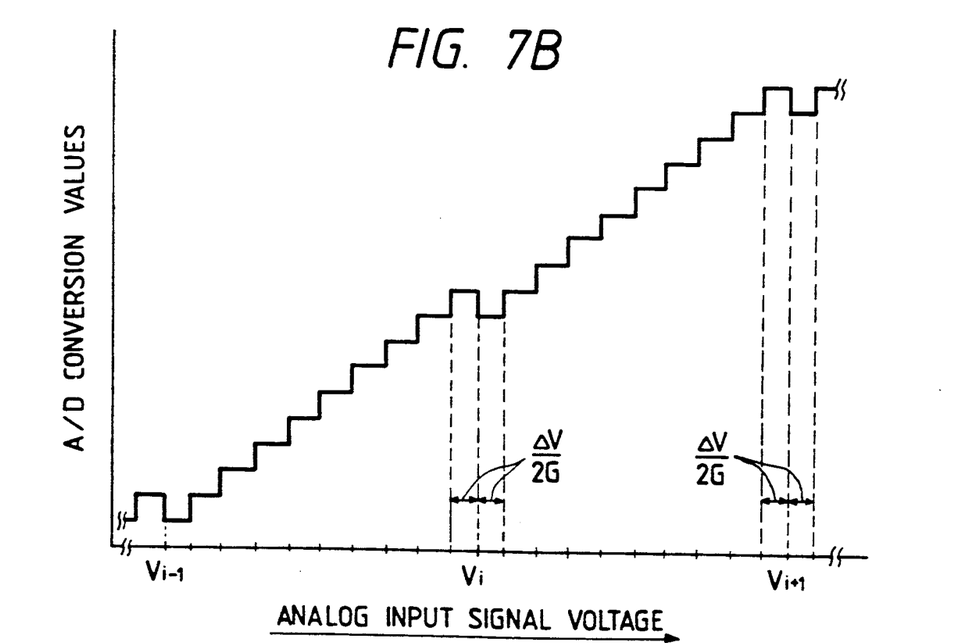

However if the buffer amplifier circuit embodiment of FIG. 2 is utilized for each of the circuits 23a, 23b in FIG. 3, then relationship between the buffer amplifier circuit output voltages and the analog input signal level will be as shown in FIG. 6A, since as described hereinabove the present invention enables the voltage error $\Delta V$ to be brought almost to zero. The gaps between the adjacent capture ranges are thereby eliminated, so that the input/output characteristic of the A-D converter will be of the form shown in FIG. 7A.

In the above description of the A-D converter embodiment of FIG. 3, it has been assumed that the output signals from the differential conversion circuit set 11 and the input signals supplied to the buffer amplifier circuits 23a, 23b are all voltage signals. However it would be equally possible to configure such an A-D converter such that current signals are produced from the differential conversion circuit set 11. In that case, the selected ones of these current signs, transferred through the switch circuit 18, could then be converted to voltage signals (e.g. by using load resistors), which would then be supplied to the buffer amplifier circuits 23a, 23b.

It can be understood from the above that the present invention provides an improved differential voltage signal buffer amplifier circuit having a simple configuration, providing a high accuracy of voltage gain. It can be further understood that such a buffer amplifier circuit can be advantageously used in the described A-D converter, to provide highly accurate interpolation-type analog/digital conversion, with no gaps between adjacent capture ranges.

What is claimed is:

1. A buffer amplifier circuit comprising:
   a first pair of transistors (2a, 2b) coupled to receive an input differential voltage signal applied between respective bases thereof, and having a load resistor (3) coupled between respective emitters thereof, for producing an output differential voltage signal across said load resistor; and
   a second pair of transistors (6a, 6b) coupled to receive said input differential voltage signal applied between respective bases thereof, and having a compensation resistor (10) coupled between respective emitters thereof, respective ones of said second pair of transistors being coupled to supply a fixed value of operating current to each of corresponding ones of said first pair of transistors, irrespective of changes in level of said input differential voltage signal.

2. A buffer amplifier circuit according to claim 1, and further comprising level shifting circuit means (7a, 7b, 8a, 8b) for receiving said input differential voltage signal, to produce a level-shifted input differential voltage signal, and in which said level-shifted differential voltage signal is applied between the bases of said second pair of transistors.

3. An analog-to-digital converter comprising:
   means (14) for generating a plurality of reference voltages;
   a plurality of differential conversion circuits (11) for converting respective potential differences between a common analog input signal and said reference voltages to corresponding differential signals;
   high-order analog-to-digital converter means including a first plurality of comparators (15) for comparing said analog input signal with respective ones of said reference voltages, to produce respective first comparison signals, and logic circuit means (16) for producing high-order bits of an output digital signal based on said first comparison signals;
   selection means (16, 18) for selecting a specific plurality of said differential signals in accordance with a condition of said comparison signals;
   a plurality of buffer amplifier circuits (23a, 23b) coupled to receive said selected differential signals;
   voltage divider means (19) for voltage-dividing said selected differential signals, transferred from said buffer amplifier circuits; and
   low-order analog-to-digital converter means including a second plurality of comparators (20) for comparing respective potential differences produced in said voltage divider means for producing respective second comparison signals, and logic circuit means (21) for producing low-order bits of said output digital signal based on said second comparison signals;
   in which each of said buffer amplifier circuits comprises:
   a first pair of transistors (2a, 2b) coupled to receive an input differential voltage signal applied between respective bases thereof, and having a load resistor (3) coupled between respective emitters thereof, for producing an output differential voltage signal across said load resistor; and
   a second pair of transistors (6a, 6b) coupled to receive said input differential voltage signal applied between respective bases thereof, and having a compensation resistor (10) coupled between respective emitters thereof, respective ones of said second pair of transistors being coupled to supply a fixed value of output current to each of corresponding ones of said first pair of transistors, irrespective of changes in level of said input differential voltage signal.

4. An analog-to-digital converter according to claim 3, in which said first plurality of comparators receive respective ones of said differential voltage signals, for use in comparing said analog input signal with said reference voltages.

5. An analog-to-digital converter according to claim 3, in which said first plurality of comparators directly receive said analog input signal and said reference voltages, for use in comparing said analog input signal with said reference voltages.

* * * * *